United States Patent
Toshikawa et al.

(10) Patent No.: US 10,892,165 B2
(45) Date of Patent: Jan. 12, 2021

(54) SEMICONDUCTOR MANUFACTURING DEVICE AND METHOD OF POLISHING SEMICONDUCTOR SUBSTRATE

(71) Applicant: LAPIS SEMICONDUCTOR CO., LTD., Kanagawa (JP)

(72) Inventors: Kiyohiko Toshikawa, Miyazaki (JP); Hiroyuki Baba, Miyazaki (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/103,250

(22) Filed: Aug. 14, 2018

(65) Prior Publication Data

US 2019/0067026 A1   Feb. 28, 2019

(30) Foreign Application Priority Data

Aug. 22, 2017   (JP) .................... 2017-159575

(51) Int. Cl.
*B24B 37/30*   (2012.01)
*B24B 49/16*   (2006.01)
*H01L 21/306*   (2006.01)

(52) U.S. Cl.
CPC ........ *H01L 21/30625* (2013.01); *B24B 37/30* (2013.01); *B24B 49/16* (2013.01)

(58) Field of Classification Search
None
See application file for complete search history.

(56) References Cited

U.S. PATENT DOCUMENTS

| 5,645,682 | A | * | 7/1997 | Skrovan | B24B 53/00 438/692 |
| 5,700,180 | A | * | 12/1997 | Sandhu | B23Q 15/013 451/21 |
| 6,206,759 | B1 | * | 3/2001 | Agarwal | B24B 37/22 451/307 |
| 6,213,844 | B1 | * | 4/2001 | Lenkersdorfer | B24B 37/013 257/E21.23 |
| 6,301,006 | B1 | * | 10/2001 | Doan | B24B 37/013 257/E21.23 |
| 6,592,443 | B1 | * | 7/2003 | Kramer | B24B 37/22 257/E21.23 |

(Continued)

FOREIGN PATENT DOCUMENTS

JP   2003-209077 A   7/2003
JP   2015-041700 A   3/2015

*Primary Examiner* — Evren Seven
(74) *Attorney, Agent, or Firm* — Volentine, Whitt & Francos, PLLC

(57) ABSTRACT

A semiconductor manufacturing device including: a polishing head that is capable of retaining a semiconductor substrate; a polishing pad having a processing surface to be abutted to the semiconductor substrate retained by the polishing head, the processing surface including a groove; a platen that is capable of rotating about a rotary shaft running along a direction intersecting the processing surface, in a state in which the polishing pad is retained by the platen; a measuring section that is configured to output a measurement value indicating a height of the processing surface at a predetermined location along a circumference of a circle centered about the rotary shaft of the platen; and a derivation section that is configured to derive a depth of the groove from the measurement value of the measuring section.

7 Claims, 7 Drawing Sheets

(56) References Cited

U.S. PATENT DOCUMENTS

| | | | |
|---|---|---|---|
| 6,623,329 B1* | 9/2003 | Moore | B24B 37/30 |
| | | | 451/287 |
| 6,866,566 B2* | 3/2005 | Taylor | B24B 53/12 |
| | | | 451/443 |
| 6,939,198 B1* | 9/2005 | Swedek | B24B 37/013 |
| | | | 451/41 |
| 6,969,306 B2* | 11/2005 | Taylor | B24B 37/105 |
| | | | 451/41 |
| 6,986,700 B2* | 1/2006 | Agarwal | B24B 21/04 |
| | | | 451/296 |
| 7,094,695 B2* | 8/2006 | Taylor | B24B 53/017 |
| | | | 438/691 |
| 7,182,669 B2* | 2/2007 | Elledge | B24B 37/013 |
| | | | 156/345.27 |
| 8,617,908 B2* | 12/2013 | Gaillard | B24B 37/013 |
| | | | 438/5 |
| 9,017,140 B2* | 4/2015 | Allison | B24B 37/205 |
| | | | 451/526 |
| 9,156,124 B2* | 10/2015 | Allison | B24B 37/205 |
| 10,456,886 B2* | 10/2019 | Ganapathiappan | B33Y 10/00 |
| 2002/0124957 A1* | 9/2002 | Hofmann | B24B 37/013 |
| | | | 156/345.12 |
| 2002/0127958 A1* | 9/2002 | Blalock | B24B 37/26 |
| | | | 451/56 |
| 2005/0105693 A1* | 5/2005 | Zhao | G06T 11/006 |
| | | | 378/210 |
| 2009/0305612 A1* | 12/2009 | Miyazaki | H01L 21/67739 |
| | | | 451/11 |
| 2014/0273308 A1* | 9/2014 | Matsuo | B24B 49/12 |
| | | | 438/16 |
| 2015/0336234 A1* | 11/2015 | Kimura | B24B 1/00 |
| | | | 438/692 |
| 2016/0172255 A1* | 6/2016 | Kramer | H01L 21/30625 |
| | | | 438/4 |
| 2016/0375545 A1* | 12/2016 | Qian | B24B 37/22 |
| | | | 438/692 |
| 2017/0120416 A1* | 5/2017 | Chockalingam | H01L 21/30625 |
| 2017/0133252 A1* | 5/2017 | Fung | H01L 21/67294 |
| 2017/0256414 A1* | 9/2017 | Liu | H01L 21/67092 |
| 2018/0264619 A1* | 9/2018 | Yoshida | B24B 49/04 |

* cited by examiner

SEMICONDUCTOR MANUFACTURING DEVICE AND METHOD OF POLISHING SEMICONDUCTOR SUBSTRATE

CROSS-REFERENCE TO RELATED APPLICATION

This application is based on and claims priority under 35 USC 119 from Japanese Patent Application No. 2017-159575 filed on Aug. 22, 2017, the disclosure of which is incorporated by reference herein.

BACKGROUND

Technical Field

The present disclosure relates to a semiconductor manufacturing device and a method of polishing a semiconductor substrate.

Related Art

Known technology relating to a chemical mechanical polishing (CMP) device employed in a CMP process of a semiconductor wafer (semiconductor substrate) includes the following.

For example, Japanese Patent Application Laid-Open (JP-A) No. 2003-209077 describes a CMP device including a rotatable polishing table with a polishing pad installed on an upper surface thereof, and a rotatable polishing head that attaches to a semiconductor wafer and causes the semiconductor wafer to contact the polishing pad to polish the semiconductor wafer. The polishing pad is formed with grooves that extend in a radiating pattern from the center of the polishing pad.

JP-A No. 2015-41700 describes a method of measuring the surface roughness of a polishing pad. This method including a process of obtaining an image of the polishing pad surface using a laser microscope, a processing of selecting only regions with a height greater than an average height within the obtained image, and a process of computing the surface roughness from only the selected regions.

In the technology described in JP-A No. 2003-209077, slurry is able to be efficiently supplied to the surface of the polishing pad due to the grooves extending in a radiating pattern from the center of the polishing pad. However, the depth of the grooves formed in the surface of the polishing pad becomes shallower as the number of semiconductor wafers processed rises.

When this occurs, slurry is insufficiently supplied to the polishing pad surface, leading to a drop in the polishing rate and a drop in the in-plane uniformity of the polishing rate in semiconductor wafers.

SUMMARY

In consideration of the above circumstances, an object of the present disclosure is to prevent the occurrence of issues arising from a change in the depth of grooves formed in the surface of a polishing pad.

A semiconductor manufacturing device according to the present disclosure includes a polishing head, a polishing pad, a platen, a measuring section, and a derivation section. The polishing head is capable of retaining a semiconductor substrate. The polishing pad includes a groove in a processing surface abutted by the semiconductor substrate retained by the polishing head. The platen is capable of rotating about a rotary shaft running along a direction intersecting the processing surface, in a state in which the polishing pad is retained by the platen. The measuring section outputs a measurement value indicating a height of the processing surface at a predetermined location along a circumference of a circle centered about the rotary shaft of the platen. The derivation section derives a depth of the groove from the measurement value of the measuring section.

A method of polishing a semiconductor substrate according to the present disclosure includes a polishing process, a cleaning process, and a measuring process. In the polishing process, a polishing material is supplied to a processing surface of a polishing pad that includes a groove, and a semiconductor substrate is caused to abut the processing surface to polish the semiconductor substrate in a state in which the processing surface is rotated about a rotary shaft running along a direction intersecting the processing surface. In the cleaning process, cleaning fluid is supplied to the processing surface to clean the processing surface. In the measuring process, a depth of the groove is measured after the cleaning process.

The present disclosure enables the occurrence of issues arising from a change in the depth of grooves formed in the surface of a polishing pad to be prevented.

BRIEF DESCRIPTION OF THE DRAWINGS

Exemplary embodiments of the present disclosure will be described in detail based on the following figures, wherein.

DETAILED DESCRIPTION

Figure 1:
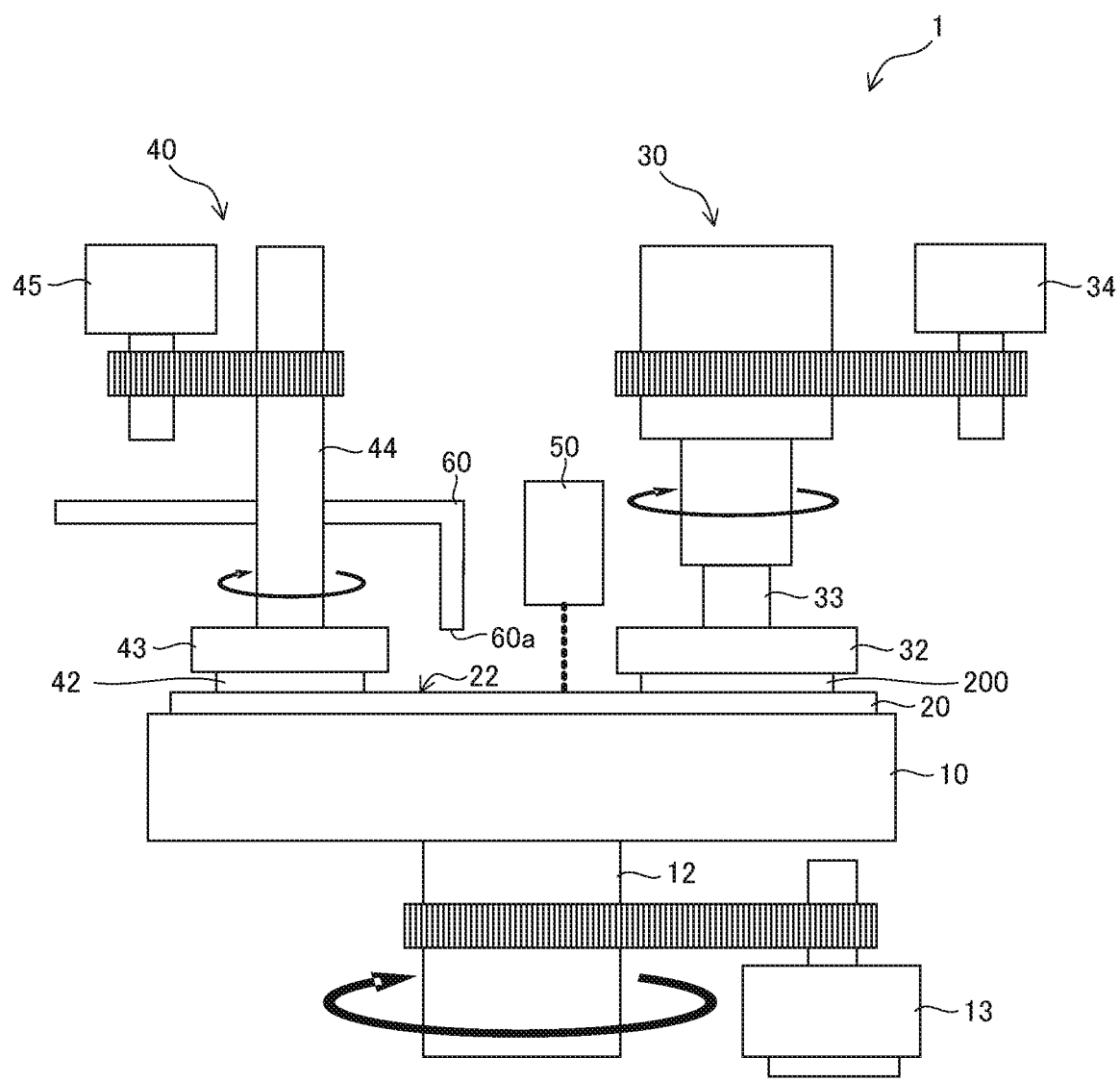
FIG. 1 is a side view illustrating a configuration of a CMP device according to an exemplary embodiment of the present disclosure.

Explanation follows regarding an exemplary embodiment of the present disclosure, with reference to the drawings. Note that in the drawings, configuration elements and portions that are the same or equivalent in practice are allocated the same reference numerals.

Figure 2:
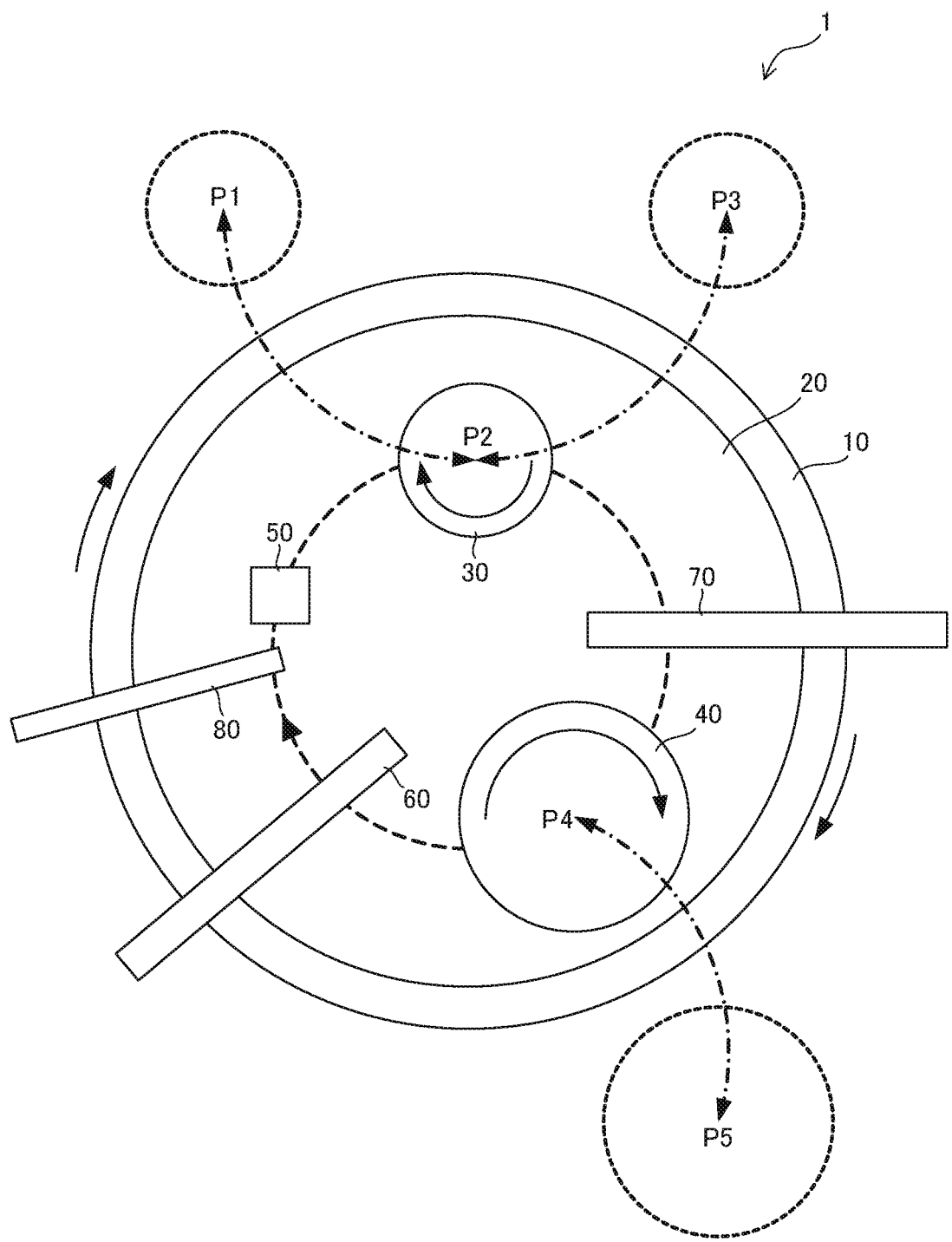
FIG. 2 is a plan view schematically illustrating a CMP device according to an exemplary embodiment of the present disclosure.

FIG. 1 is a side view illustrating a configuration of a CMP device 1 serving as a semiconductor manufacturing device according to the present exemplary embodiment of the present disclosure, and FIG. 2 is a plan view schematically illustrating the CMP device 1.

The CMP device 1 is configured including a platen 10, a polishing pad 20, a polishing head 30, a dresser 40, a laser displacement gauge 50, a slurry supply nozzle 60, a cleaning fluid supply nozzle 70 (see FIG. 2), and a gas ejection nozzle 80 (see FIG. 2).

The platen 10 is a platform that supports the polishing pad 20. An upper surface of the platen 10 is a horizontal flat surface with a circular outer circumference. The polishing pad 20 is affixed to the upper surface of the platen 10. A rotary shaft 12 that extends in a direction orthogonal to the horizontal upper surface of the platen 10 is provided at the center of a lower surface of the platen 10. The platen 10 is able to be rotated about the rotary shaft 12 by a motor 13.

Figure 3:
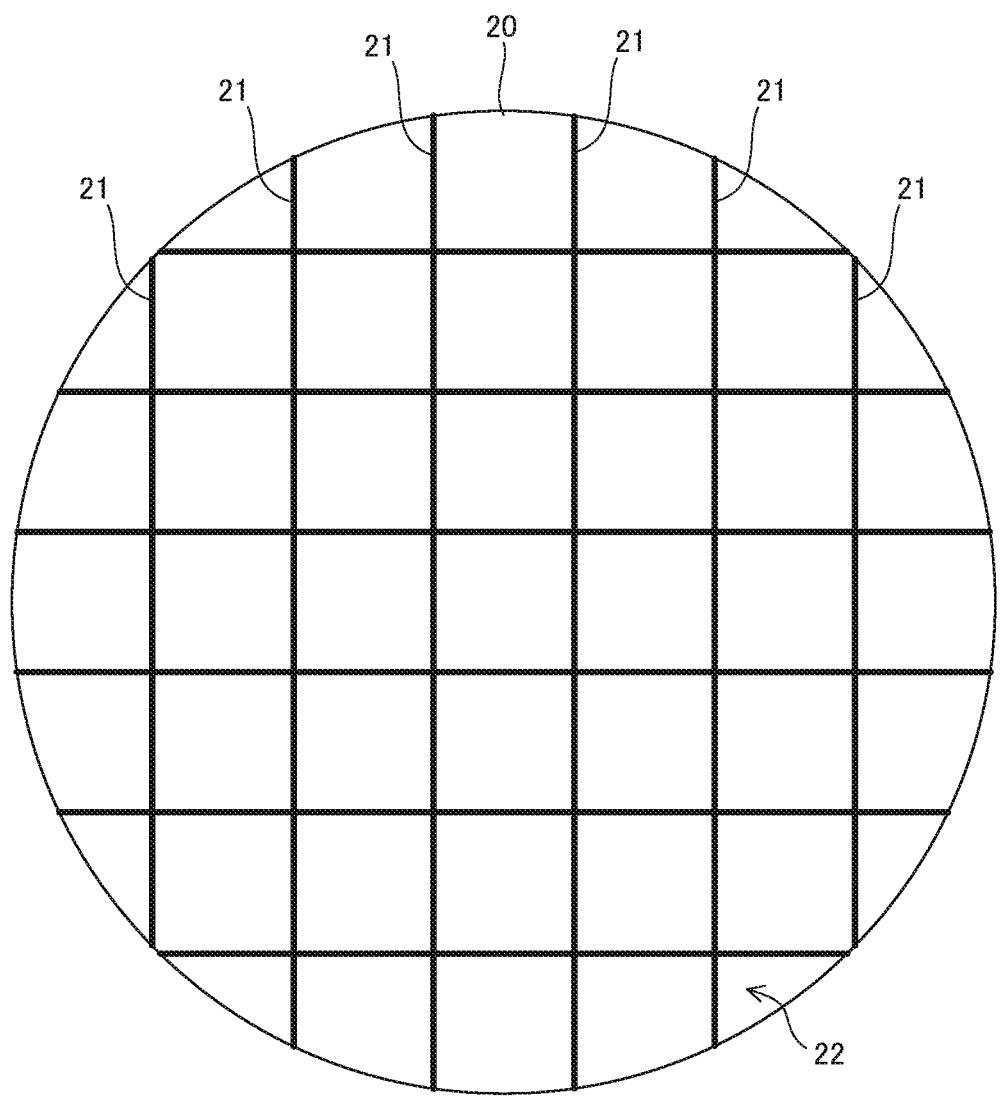
FIG. 3 is a plan view of a polishing pad according to an exemplary embodiment of the present disclosure.

The polishing pad 20 is affixed to the upper surface of the platen 10. An upper surface of the polishing pad 20 configures a processing surface 22 that polishes a semiconductor wafer 200 retained by the polishing head 30. Recesses and projections are formed at the outermost surface of the processing surface 22 so as to promote polishing of a main surface of the semiconductor wafer 200. FIG. 3 is a plan view of the polishing pad 20 viewed from the processing surface 22 side of the polishing pad 20. As illustrated in FIG. 3, grooves 21 with a depth of approximately 500 μm are formed across the entire processing surface 22 of the polishing pad 20. As a result of the grooves 21 formed in the processing surface 22 of the polishing pad 20, slurry discharged from a discharge port 60*a* of the slurry supply nozzle 60 is able to flow into the grooves 21 and spread across the entire processing surface 22 of the polishing pad 20. The polishing pad 20 rotates with rotation of the platen 10. There is no particular limitation to the material of the polishing pad 20, and foamed polyurethane, for example, may be suitably employed therefor.

The slurry supply nozzle 60 is a nozzle for supplying slurry, serving as a polishing material, to the processing surface 22 of the polishing pad 20. The slurry supply nozzle 60 discharges slurry from the discharge port 60*a* disposed above the polishing pad 20.

The polishing head 30 includes a retention portion 32 that retains a semiconductor wafer 200. The retention portion 32 is controlled such that a retention surface that retains a semiconductor wafer 200 is parallel to the processing surface 22 of the polishing pad 20 while the semiconductor wafer 200 is being polished. A rotary shaft 33 that extends in a direction orthogonal to the main surface of a semiconductor wafer 200 retained by the retention portion 32 is provided at the center of an upper surface of the retention portion 32. The retention portion 32 is able to be rotated about the rotary shaft 33 by a motor 34 in a state in which a semiconductor wafer 200 is being retained by the retention portion 32. The retention portion 32 is also able to be raised and lowered in a direction orthogonal to the main surface of the semiconductor wafer 200 (i.e. the up-down direction). The retention portion 32 is lowered when the semiconductor wafer 200 is to be polished, thereby applying a pressing force pressing the main surface of the semiconductor wafer 200 against the processing surface 22 of the polishing pad 20. As illustrated in FIG. 2, the polishing head 30 is able to be moved between a pickup position P1 for picking up an unprocessed semiconductor wafer 200, a processing position P2 for polishing the semiconductor wafer 200, and a dispensing position P3 for dispensing the polished semiconductor wafer 200.

The dresser 40 performs conditioning, including what is known as setting, to roughen the processing surface 22 of the polishing pad 20 in order to restore the polishing rate, which drops the as the number of semiconductor wafers polished increases. A surface of the dresser 40 that abuts the polishing pad 20 includes a circular plate 43 provided with plural diamond particles 42. A rotary shaft 44 that extends in a direction orthogonal to a main surface of the plate 43 is provided at the center of an upper surface of the plate 43. The plate 43 is able to be rotated about the rotary shaft 44 by a motor 45. As illustrated in FIG. 2, the dresser 40 is able to be moved between a processing position P4 for conditioning the polishing pad 20 and a retracted position P5 when conditioning is not to be performed. When positioned in the processing position P4, the dresser 40 is disposed on the circumference of the same circle centered about the rotary shaft of the platen 10 as the polishing head 30 when positioned in the processing position P2. The polishing pad 20 may be conditioned by the dresser 40 in parallel with semiconductor wafer polishing, or conditioning may be performed after a semiconductor wafer 200 has been polished. The dresser 40 may, for example, be used to condition the polishing pad 20 each time a semiconductor wafer is polished, or when a predetermined number of semiconductor wafers have been polished.

The laser displacement gauge 50, configuring a measuring section, is fixed and set above the polishing pad 20, on the circumference of the same circle centered about the rotary shaft of the platen 10 as the polishing head 30 when positioned in the processing position P2. The laser displacement gauge 50 outputs measurement values indicating a height of the processing surface 22 of the polishing pad 20. The measurement of a height of the processing surface of the polishing pad 20 by the laser displacement gauge 50 is performed in a state in which the platen 10 and the polishing pad 20 are rotating about the rotary shaft 12. A height of the processing surface 22 of the polishing pad 20 is thus measured at locations on the circumference of the circle centered about the rotary shaft of the platen 10. The laser displacement gauge 50 outputs measurement values for a height of the processing surface 22 by shining a laser beam on the processing surface 22 of the polishing pad 20 and receiving a reflected beam reflected by the processing surface 22. In addition to an optical displacement sensor such as a laser displacement gauge, another type of displacement sensor, such as a linear proximity sensor or an ultrasound displacement sensor, may be employed to measure a height of the processing surface 22 of the polishing pad 20.

The cleaning fluid supply nozzle 70 (see FIG. 2) is a nozzle for supplying cleaning fluid to the processing surface 22 of the polishing pad 20, and discharges cleaning fluid from a discharge port disposed above the polishing pad 20. Cleaning fluid supplied from the cleaning fluid supply nozzle 70 cleans off used slurry remaining on the processing surface 22 of the polishing pad 20 and any by-products generated by polishing. Purified water may be employed for the cleaning fluid. The polishing pad 20 may, for example, be cleaned each time a semiconductor wafer is polished, or when a predetermined number of semiconductor wafers have been polished.

The gas ejection nozzle 80 (see FIG. 2) is a nozzle for ejecting gas such as nitrogen ($N_2$) gas onto the processing surface 22 of the polishing pad 20. An ejection port of the gas ejection nozzle 80 is in close proximity to the laser displacement gauge 50, and is disposed upstream of the laser displacement gauge 50 the direction of rotation of the platen 10. Any slurry or cleaning fluid remaining on the processing surface 22 of the polishing pad 20 is removed by gas ejected from the ejection port of the gas ejection nozzle 80.

Figure 4:
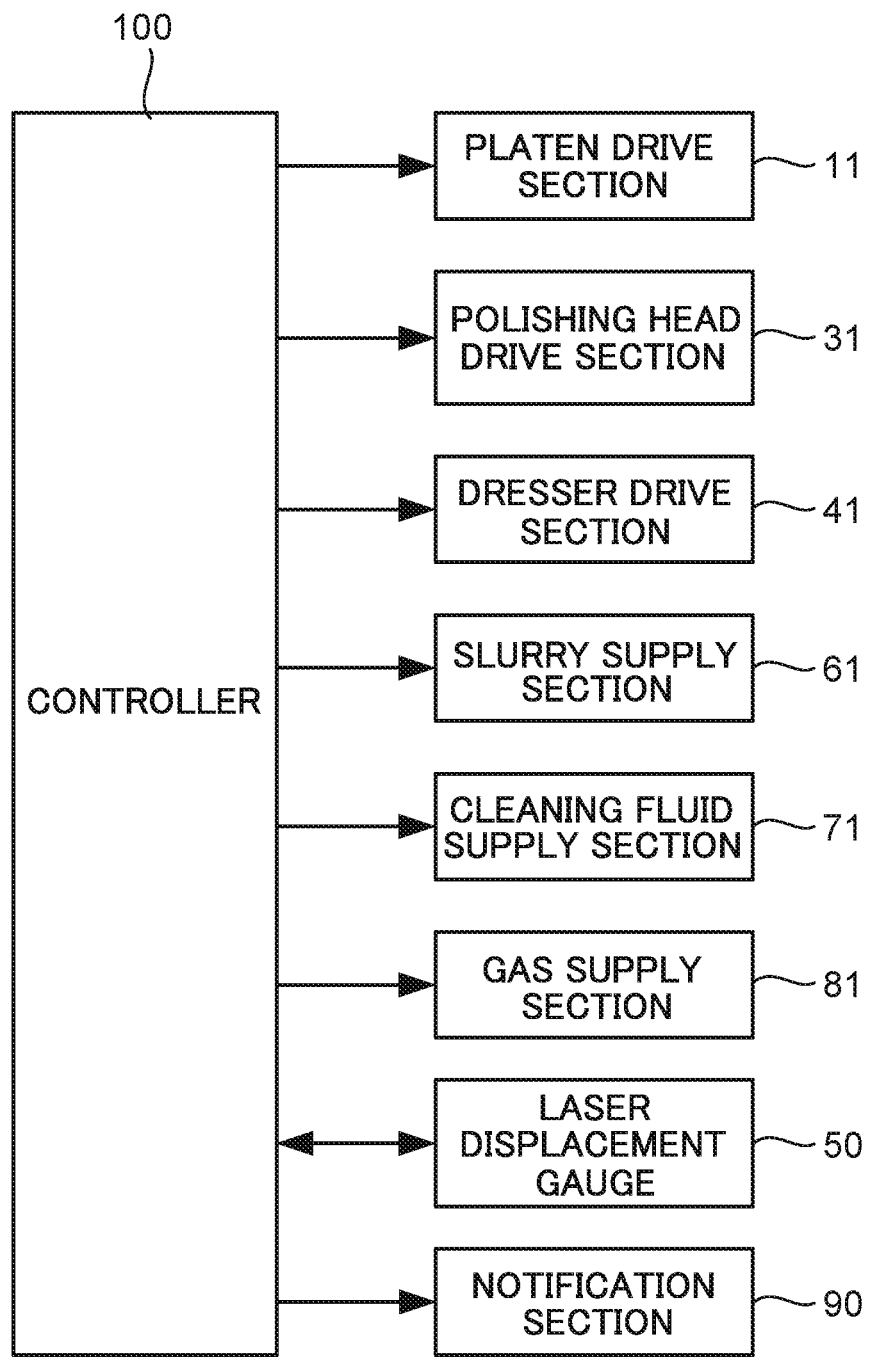
FIG. 4 illustrates an example of configuration of a control system of a CMP device according to an exemplary embodiment of the present disclosure.

FIG. 4 illustrates an example of configuration of a control system of the CMP device 1. As illustrated in FIG. 4, the CMP device 1 includes a platen drive section 11, a polishing head drive section 31, a dresser drive section 41, a slurry supply section 61, a cleaning fluid supply section 71, a gas supply section 81, the laser displacement gauge 50, a notification section 90, and a controller 100.

The platen drive section 11 is configured including the motor 13, which is driven to rotate the platen 10 under the control of the controller 100.

The polishing head drive section 31 is configured including the motor 34. The polishing head drive section 31 rotates the retention portion 32 configuring the polishing head 30 and moves the polishing head 30 to the pickup position P1, the processing position P2, or the dispensing position P3 under the control of the controller 100. The polishing head drive section 31 also raises or lowers the polishing head 30 in the up-down direction and presses a semiconductor wafer 200 retained by the retention portion 32 against the processing surface 22 of the polishing pad 20 under the control of the controller 100.

The dresser drive section 41 is configured including the motor 45. The dresser drive section 41 rotates the plate 43 configuring the dresser 40 and moves the dresser 40 to the processing position P4 or the retracted position P5 under the control of the controller 100.

The slurry supply section 61 is configured including a pump (not illustrated in the drawings) connected through piping (not illustrated in the drawings) to a tank (not illustrated in the drawings) where slurry is stored. The slurry supply section 61 supplies slurry to the processing surface 22 of the polishing pad 20 through the slurry supply nozzle 60 under the control of the controller 100.

The cleaning fluid supply section 71 is configured including a pump (not illustrated in the drawings) connected through piping (not illustrated in the drawings) to a tank (not illustrated in the drawings) where cleaning fluid is stored. The cleaning fluid supply section 71 supplies cleaning fluid to the processing surface 22 of the polishing pad 20 through the cleaning fluid supply nozzle 70 under the control of the controller 100.

The gas supply section 81 is configured including a compressor (not illustrated in the drawings). The gas supply section 81 ejects gas such as nitrogen ($N_2$) gas onto the processing surface 22 of the polishing pad 20 through the gas ejection nozzle 80 under the control of the controller 100.

The laser displacement gauge 50 measures a height of the processing surface 22 of the polishing pad 20 and outputs measurement values under the control of the controller 100.

The notification section 90 is configured including at least one out of a speaker, a lamp, or a display panel such as a liquid crystal display. Under the control of the controller 100, the notification section 90 issues a notification when the depth of the grooves 21 formed in the processing surface 22 of the polishing pad 20 is less than or equal to a predetermined depth.

The controller 100 performs overall control of the platen drive section 11, the polishing head drive section 31, the dresser drive section 41, the slurry supply section 61, the cleaning fluid supply section 71, the gas supply section 81, the laser displacement gauge 50, and the notification section 90.

Figure 5:
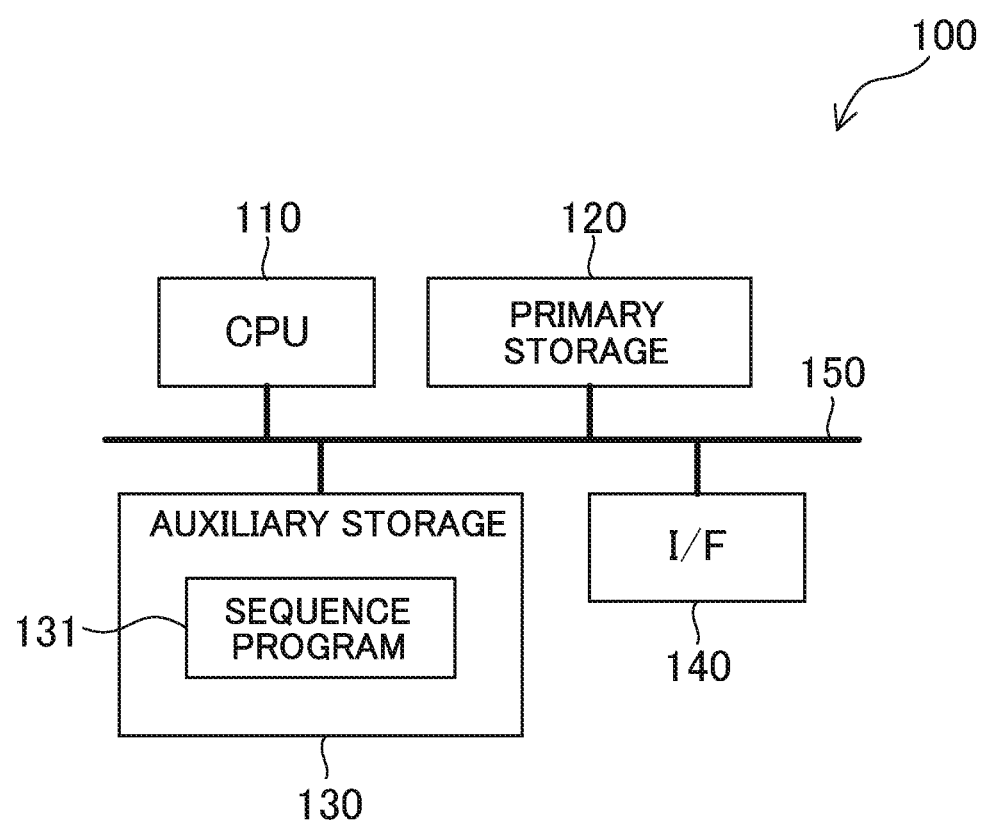
FIG. 5 is a block diagram illustrating a hardware configuration of a controller according to an exemplary embodiment of the present disclosure.

FIG. 5 is a block diagram illustrating a hardware configuration of the controller 100. The controller 100 is configured by a computer including a central processing unit (CPU) 110, primary storage 120, auxiliary storage 130, and an interface 140 that are connected to each other through a bus 150. The CPU 110 executes a sequence program 131 stored in the auxiliary storage 130. The primary storage 120 includes a storage region for temporarily storing data or a program being executed, and is configured by random access memory (RAM), for example. The auxiliary storage 130 is non-volatile storage such as read only memory (ROM) or flash memory. The sequence program 131 is stored in the auxiliary storage 130. The interface 140 is an interface by which the CPU 110 respectively communicates with the platen drive section 11, the polishing head drive section 31, the dresser drive section 41, the slurry supply section 61, the cleaning fluid supply section 71, the gas supply section 81, the laser displacement gauge 50, and the notification section 90.

Figure 6:
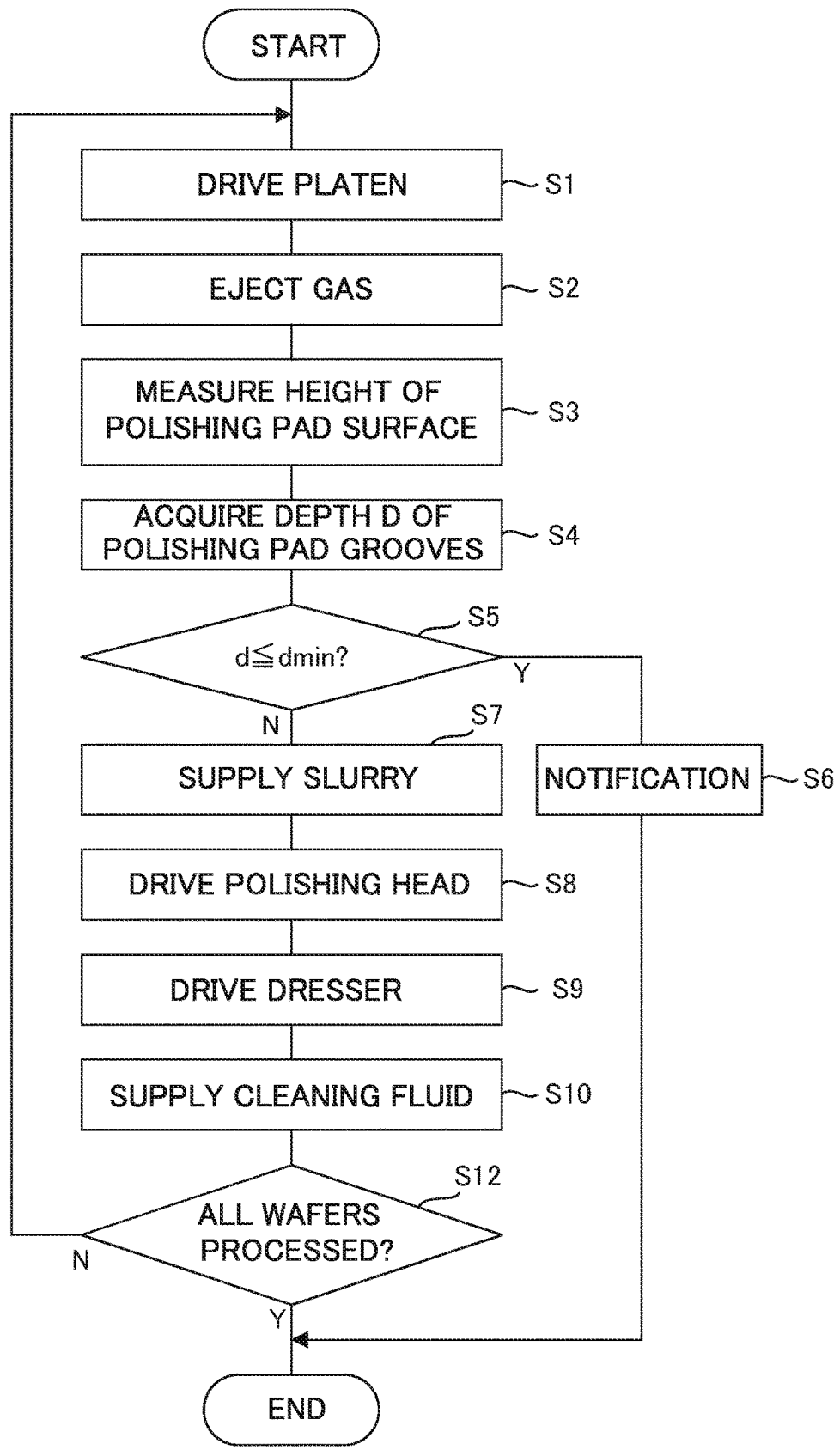
FIG. 6 is a flowchart illustrating an example of an operation sequence of a CMP device according to an exemplary embodiment of the present disclosure.

FIG. 6 is a flowchart illustrating an example of an operation sequence of the CMP device 1 implemented by the CPU 110 executing the sequence program 131.

At step S1, the controller 100 supplies a control signal to the platen drive section 11. The platen drive section 11 rotates the platen 10 about the rotary shaft 12 based on this control signal. The polishing pad 20 rotates with rotation of the platen 10.

At step S2, the controller 100 supplies a control signal to the gas supply section 81. The gas supply section 81 ejects gas such as nitrogen ($N_2$) gas from the ejection port of the gas ejection nozzle 80 based on this control signal. Slurry and cleaning fluid, that is, residue, remaining on the processing surface 22 of the polishing pad 20 is removed by gas ejected from the ejection port of the gas ejection nozzle 80. Gas ejection from the gas ejection nozzle 80 is performed with the platen 10 in a rotating state.

At step S3, the controller 100 supplies a control signal to the laser displacement gauge 50. The laser displacement gauge 50 measures a height of the processing surface 22 of the polishing pad 20 and outputs measurement values based on this control signal. Measurements by the laser displacement gauge 50 are performed with the platen 10 in a rotating state. Measurement values are thus obtained for locations on the processing surface 22 of the polishing pad 20 on the circumference of the circle centered about the rotary shaft 12 of the platen 10. The measurement values output from the laser displacement gauge 50 are transmitted to the controller 100.

Figure 7:
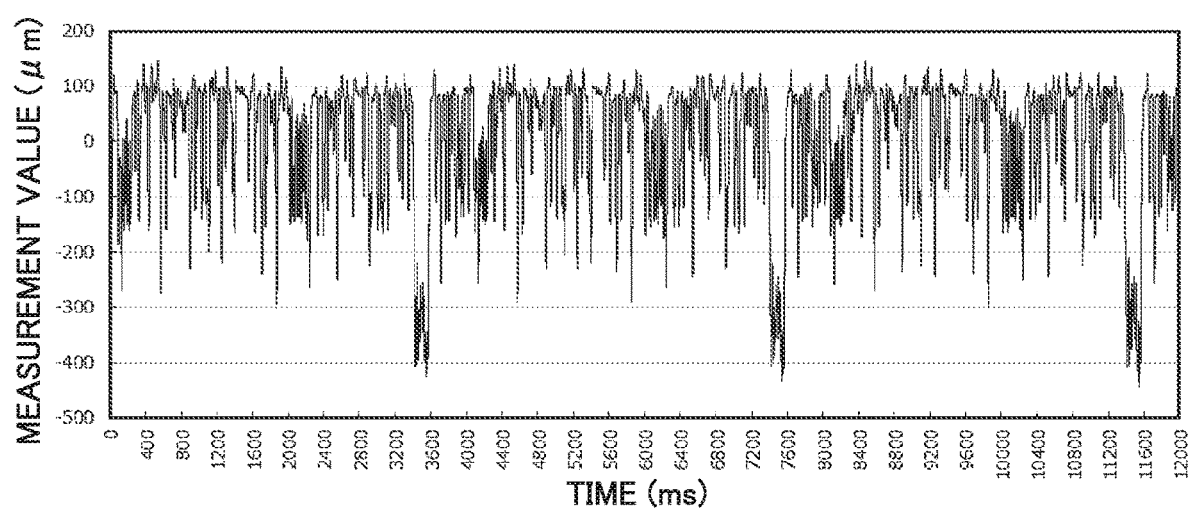
FIG. 7 is a graph illustrating an example of the variation over time of measurement values output from a laser displacement gauge according to an exemplary embodiment of the present disclosure.

FIG. 7 is a graph illustrating an example of the variation over time of measurement values output from the laser displacement gauge 50. As described above, measurements by the laser displacement gauge 50 are performed with the platen 10 in a rotating state. Accordingly, as illustrated in FIG. 7, the variation over time of the measurement values output from the laser displacement gauge 50 is periodic. In FIG. 7, the 100 µm line is the base level height of the surface of the polishing pad 20. The measurement values of approximately −400 µm that periodically appear in FIG. 7 correspond to the grooves 21 formed in the processing surface 22 of the polishing pad 20. It is thus possible to measure the depth of the grooves 21 formed in the processing surface 22 by measuring a height of the processing surface 22 of the polishing pad 20 using the fixed stationary laser displacement gauge 50 and with the platen 10 in a rotating state.

Note that if a height of the processing surface 22 of the polishing pad 20 were measured by the laser displacement gauge 50 in a state in which slurry and cleaning fluid still remained on the processing surface 22 of the polishing pad 20, there would be a possibility that measurements by the laser displacement gauge 50 being obstructed by the slurry or cleaning fluid remaining on the processing surface 22, causing a drop in measurement accuracy. In the operation sequence of the CMP device 1 according to the present exemplary embodiment, gas is ejected from the ejection port of the gas ejection nozzle 80 to remove any residue remaining on the processing surface 22 of the polishing pad 20 prior to measurement by the laser displacement gauge 50. Measurements by the laser displacement gauge 50 are thus not obstructed by residue, enabling the measurement accuracy of a height of the processing surface 22 of the polishing pad 20 to be increased. Furthermore, the ejection port of the gas ejection nozzle 80 is in close proximity to the laser displacement gauge 50, and is disposed upstream of the laser displacement gauge 50 in the direction of rotation of the platen 10. This allows the processing surface 22 to be measured directly after residue has been removed therefrom, enabling the measurement accuracy of a height of the processing surface 22 to be further increased.

At step S4, the controller 100 samples the measurement values received from the laser displacement gauge 50, and converts these sampled values to digital values. The controller 100 analyzes these digital values to derive a depth d of the grooves 21 formed in the processing surface 22 of the polishing pad 20. For example, the controller 100 may compute an average value X of all the digital values obtained by sampling the measurement values output from the laser displacement gauge 50, and derive the depth d of the grooves 21 as an average value Y of all the digital values that deviate from the average value X by at least a predetermined value.

At step S5, the controller 100 determines whether or not the depth d of the grooves 21 derived at step S4 is less than or equal to a minimum value dmin. The height of the processing surface 22 of the polishing pad 20 recedes as the number of semiconductor wafers polished increases and as the number of times the polishing pad 20 has been conditioned increases, such that the depth d of the grooves 21 becomes shallower. When the depth d of the grooves 21 is less than or equal to the minimum value dmin, there is a marked drop in the polishing rate and a drop in the in-plane uniformity of the polishing rate in semiconductor wafers. In cases in which the controller 100 determines that the depth d of the grooves 21 derived at step S4 is less than or equal to the minimum value dmin, processing transitions to step S6, and in cases in which the depth d is determined to exceed the minimum value dmin, processing transitions to step S7.

At step S6, the controller 100 supplies a control signal to the notification section 90. The notification section 90 performs a notification operation notifying that the depth d of the grooves 21 formed in the processing surface 22 of the polishing pad 20 is less than or equal to the minimum value dmin based on this control signal. For example, in cases in which the notification section 90 is configured including a speaker, notification may be made that the depth d of the grooves 21 is less than or equal to the minimum value dmin by emitting a warning sound from the speaker. In cases in which the notification section 90 is configured including a lamp, notification may be made that the depth d of the grooves 21 is less than or equal to the minimum value dmin by illuminating or flashing the lamp. In cases in which the notification section 90 is configured including a display panel such as a liquid crystal display, notification may be made that the depth d of the grooves 21 is less than or equal to the minimum value dmin by a predetermined display being shown on the display panel. After the notification operation, the controller 100 ends the present routine without any semiconductor wafers being polished. Note that processing may transition to step S7 after the notification operation.

At step S7, the controller 100 supplies a control signal to the slurry supply section 61. The slurry supply section 61 discharges slurry from the discharge port 60a of the slurry supply nozzle 60 based on this control signal. Slurry discharged from the discharge port 60a of the slurry supply nozzle 60 spreads across the entire processing surface 22 via the grooves 21 formed in the processing surface 22 of the polishing pad 20. The supply of slurry to the processing surface 22 of the polishing pad 20 may be performed with the platen 10 in a rotating state.

At step S8, the controller 100 supplies a control signal to the polishing head drive section 31. The polishing head drive section 31 moves the polishing head 30 to the pickup position P1, picks up a semiconductor wafer 200 using the retention portion 32, and then moves the polishing head 30 to the processing position P2 based on this control signal. The polishing head drive section 31 then lowers and rotates the retention portion 32 retaining the semiconductor wafer 200 about the rotary shaft 33, and applies pressing force to press the main surface of the semiconductor wafer 200 against the processing surface 22 of the polishing pad 20. The platen 10 rotates about the rotary shaft 12 while this is performed. The semiconductor wafer 200 is polished accordingly. When polishing of the semiconductor wafer 200 is complete, the polishing head drive section 31 stops rotation of the retention portion 32, moves the polishing head 30 to the dispensing position P3, and stows the polished semiconductor wafer 200 in a case or a rack disposed at the dispensing position P3.

At step S9, the controller 100 supplies a control signal to the dresser drive section 41. The dresser drive section 41 moves the dresser 40 from the retracted position P5 to the processing position P4 and rotates the plate 43 provided with the diamond particles while causing the plate to abut the processing surface 22 of the polishing pad 20 to condition the processing surface 22 of the polishing pad 20 based on this control signal. Note that the polishing pad 20 may be conditioned in parallel with semiconductor wafer polishing. Alternatively, for example, the polishing pad 20 may be conditioned when a predetermined number of semiconductor wafers have been polished. In other words, the processing of step S9 may be skipped until a predetermined number of semiconductor wafers have been polished. When the conditioning of the polishing pad 20 is complete, the dresser drive section 41 moves the dresser 40 to the retracted position P5.

At step S10, the controller 100 supplies a control signal to the cleaning fluid supply section 71. The cleaning fluid supply section 71 discharges cleaning fluid from the discharge port of the cleaning fluid supply nozzle 70 based on this control signal. Used slurry remaining on the processing surface 22 of the polishing pad 20 and by-products generated by polishing are cleaned off by the cleaning fluid supplied from the cleaning fluid supply nozzle 70. Cleaning may be performed with the platen 10 in a rotating state. Note that cleaning of the polishing pad 20 may be performed when a predetermined number of semiconductor wafers have been polished. In other words, the processing of step S10 may be skipped until a predetermined number of semiconductor wafers have been polished.

At step S12, the controller 100 determines whether or not all the semiconductor wafers to be polished have been polished. In cases in which the controller 100 determines that all the semiconductor wafers to be polished have been polished, the present routine is ended. In cases in which the controller 100 determines that not all semiconductor wafers to be polished have been polished yet, processing returns to step S1.

As described above, in the CMP device 1 of the present exemplary embodiment, the laser displacement gauge 50 outputs measurement values for a height of the processing surface 22 of the polishing pad 20, and the controller 100 derives the depth d of the grooves 21 formed in the processing surface 22 of the polishing pad 20 based on these measurement values. In cases in which the depth d of the grooves 21 is less than or equal to a predetermined depth, action can be taken, such as servicing or replacing the polishing pad 20. This enables issues arising from a change in the depth of the grooves 21, such as a drop in the polishing rate and a drop in the in-plane uniformity of the polishing rate in semiconductor wafers, to be forestalled.

In cases in which the depth d of the grooves 21 derived by the controller 100 is less than or equal to the minimum value dmin, the notification section 90 performs a predetermined notification operation. Thus, when an action such as servicing or replacing the polishing pad 20 is necessary, overlooking the timing for such action can be prevented.

The laser displacement gauge 50 is fixed above the polishing pad 20, on the circumference of the same circle centered about the rotary shaft of the platen 10 as the polishing head 30 when positioned in the processing position P2. This enables measurement values to be obtained at locations where the semiconductor wafer 200 abuts the processing surface 22 of the polishing pad 20 (namely, at locations where wear is most severe).

Gas is ejected from the ejection port of the gas ejection nozzle 80 such that any slurry or residue, such as cleaning fluid, remaining on the processing surface 22 of the polishing pad 20 is removed prior to a height of the processing surface 22 of the polishing pad 20 being measured. This enables the accuracy of a height of the processing surface 22 of the polishing pad 20 measured by the laser displacement gauge 50 to be improved. Further, the ejection port of the gas ejection nozzle 80 is in close proximity to the laser displacement gauge 50, and is disposed upstream of the laser displacement gauge 50 in the direction of rotation of the platen 10. This allows a height of the processing surface 22 to be measured by the laser displacement gauge 50 directly after any residue has been removed therefrom, enabling the measurement accuracy to be further improved.

What is claimed is:

1. A semiconductor manufacturing device comprising:
   a polishing head that is capable of retaining a semiconductor substrate;
   a polishing pad having a processing surface to be abutted to the semiconductor substrate retained by the polishing head, the processing surface including grooves;
   a platen that is capable of rotating about a rotary shaft running along a direction intersecting the processing surface, in a state in which the polishing pad is retained by the platen;
   a measuring section that is disposed above the polishing pad on a circumference of a same circle centered about the rotary shaft of the platen as the polishing head, and that is configured to output a measurement value indicating a height of the processing surface at predetermined locations on the circumference of the same circle centered about the rotary shaft of the platen;
   a derivation section that that is configured to derive a depth of the grooves from the measurement value of the measuring section;
   a slurry supply nozzle that is configured to supply slurry to the processing surface of the polishing pad; and
   a gas ejection nozzle that is disposed upstream of the measuring section in a direction of rotation of the platen, and that is disposed downstream of the slurry supply nozzle in the direction of rotation of the platen.

2. The semiconductor manufacturing device of claim 1, further comprising a dresser that is disposed on the circumference of the same circle centered about the rotary shaft of the platen as the polishing head, and that is configured to perform conditioning of the processing surface.

3. The semiconductor manufacturing device of claim 1, wherein the gas ejection nozzle includes an ejection port that ejects gas and that is disposed adjacent to the measuring section.

4. The semiconductor manufacturing device of claim 3, wherein the measuring section is configured to output the measurement value for the processing surface after residue on the processing surface has been removed by gas ejected from the ejection port of the gas ejection nozzle.

5. The semiconductor manufacturing device of claim 1, wherein the measuring section is configured including a laser displacement gauge.

6. The semiconductor manufacturing device of claim 1, wherein the polishing head is configured to abut the semiconductor substrate against the processing surface of the polishing pad to polish the semiconductor substrate after output of the measurement value by the measuring section.

7. The semiconductor manufacturing device of claim 1, further comprising a notification section that is configured to perform a predetermined notification operation in cases in which the depth of the grooves derived by the derivation section is less than or equal to a predetermined depth.

* * * * *